(12) United States Patent
Sun et al.

(10) Patent No.: US 11,408,556 B2
(45) Date of Patent: Aug. 9, 2022

(54) WALL HANGING PIECE AND DISPLAY DEVICE

(71) Applicant: BOE TECHNOLOGY GROUP CO., LTD., Beijing (CN)

(72) Inventors: Junmin Sun, Beijing (CN); Lei Cao, Beijing (CN); Yan Ren, Beijing (CN); Zifeng Wang, Beijing (CN); Deli Fang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 91 days.

(21) Appl. No.: 17/255,877

(22) PCT Filed: Oct. 21, 2019

(86) PCT No.: PCT/CN2019/112204
§ 371 (c)(1),
(2) Date: Dec. 23, 2020

(87) PCT Pub. No.: WO2020/083185
PCT Pub. Date: Apr. 30, 2020

(65) Prior Publication Data
US 2021/0262612 A1    Aug. 26, 2021

(30) Foreign Application Priority Data
Oct. 25, 2018    (CN) .......................... 201821736687.5

(51) Int. Cl.
*H05K 5/02* (2006.01)
*F16M 13/02* (2006.01)
*H05K 5/00* (2006.01)

(52) U.S. Cl.
CPC ........... *F16M 13/02* (2013.01); *H05K 5/0017* (2013.01); *H05K 5/0204* (2013.01)

(58) Field of Classification Search
None
See application file for complete search history.

(56) References Cited

U.S. PATENT DOCUMENTS 4,558,839 A * 12/1985 Kaplan .................. F16M 13/02
248/221.12
10,473,259 B1 * 11/2019 Chen ...................... F16M 11/00
(Continued)

FOREIGN PATENT DOCUMENTS

| CN | 2812229 Y | 8/2006 |
| CN | 2881893 Y | 3/2007 |

(Continued)

*Primary Examiner* — Xanthia C Cunningham
(74) *Attorney, Agent, or Firm* — Nath, Goldberg & Meyer; Joshua B. Goldberg

(57) ABSTRACT

Disclosed is a display device, including: a wall hanging piece and comprising a hanging portion, wherein the hanging portion is plate-shaped and has a first length direction; a hanging hole provided on the hanging portion and comprising a stripe-shaped hole having a second length direction, and wherein an included angle between the first length direction and the second length direction is larger than 0 degree and smaller than 90 degrees; and a display panel comprising a display surface, a back surface, and a display frame; a suspension member provided on the back surface of the display panel, wherein the suspension member passes through a terminal end of the hanging hole of the wall hanging piece, and wherein the display frame is in close contact with the wall surface in a state that the display panel is fixed on the wall surface through the wall hanging piece.

15 Claims, 3 Drawing Sheets

(56) References Cited

U.S. PATENT DOCUMENTS

| | | | | |
|---|---|---|---|---|
| 2003/0201372 | A1* | 10/2003 | Dozier | F16M 11/10 |
| | | | | 248/495 |
| 2005/0211646 | A1* | 9/2005 | Watanabe | H05K 5/0204 |
| | | | | 211/26 |
| 2007/0057133 | A1* | 3/2007 | Cottingham | F16M 13/02 |
| | | | | 248/309.1 |
| 2008/0083865 | A1* | 4/2008 | Matsui | F16M 11/10 |
| | | | | 248/496 |
| 2010/0321917 | A1* | 12/2010 | Kim | H04N 9/12 |
| | | | | 361/829 |
| 2011/0011993 | A1* | 1/2011 | Cheng | F16M 13/02 |
| | | | | 248/205.1 |
| 2011/0297810 | A1* | 12/2011 | Tachibana | F16M 11/10 |
| | | | | 248/278.1 |
| 2013/0258235 | A1 | 10/2013 | Li | |
| 2013/0306816 | A1* | 11/2013 | Yoshida | F16M 13/02 |
| | | | | 248/224.51 |
| 2017/0356594 | A1* | 12/2017 | Fu | F16M 11/42 |
| 2017/0367505 | A1* | 12/2017 | Pyle | A47G 1/10 |
| 2018/0344059 | A1* | 12/2018 | Castilleja | F16M 13/02 |

FOREIGN PATENT DOCUMENTS

| | | |
|---|---|---|
| CN | 101672418 A | 3/2010 |
| CN | 203068088 U | 7/2013 |
| CN | 105202339 A | 12/2015 |
| CN | 105351710 A | 2/2016 |
| CN | 106870907 A | 6/2017 |
| CN | 208907542 U | 5/2019 |
| JP | 2011123269 A | 6/2011 |

* cited by examiner

WALL HANGING PIECE AND DISPLAY DEVICE

CROSS REFERENCE TO RELATED APPLICATION

This application is a National Phase Application filed under 35 U.S.C. 371 as a national stage of PCT/CN2019/112204, filed on Oct. 21, 2019, an application claiming the priority of the Chinese patent application No. 201821736687.5, filed on Oct. 25, 2018, the contents of which are incorporated herein by reference in their entirety.

FIELD OF THE DISCLOSURE

The present disclosure relates to but is not limited to the field of display device fixing technologies, and in particular to a wall hanging piece and a display device having the wall hanging piece.

BACKGROUND

As display devices become thinner and lighter, users are inclined to hang the display devices on a wall.

For example, an electronic picture frame, which is a display device capable of continuously displaying contents of paintings, can truly simulate the appearance of paintings, and has been widely used for artistic exhibition, appreciation and dissemination.

The electronic picture frame is usually hung on an installation base surface such as a wall through a wall hanging piece, the wall hanging piece being connected to the wall by a fixation bolt, and a hanging screw on a back surface of the electronic picture frame passes through a stripe-shaped hole of the wall hanging piece, so that the electronic picture frame is hung on the wall hanging piece, namely, the electronic picture frame is hung on the wall just like a painting.

SUMMARY

In an embodiment of the present disclosure, there is provided a display device, including:

a wall hanging piece configured to be fixed on a wall surface and comprising a hanging portion, wherein the hanging portion is plate-shaped and has a first length direction; a hanging hole provided on the hanging portion and comprising a stripe-shaped hole having a second length direction, and wherein an included angle between the first length direction and the second length direction is larger than 0 degree and smaller than 90 degrees; and a display panel comprising a display surface, a back surface opposite to the display surface, and a display frame provided around an outer periphery of the display surface; a suspension member provided on the back surface of the display panel, wherein the suspension member passes through a terminal end of the hanging hole of the wall hanging piece, and wherein the display frame is in close contact with the wall surface in a state that the display panel is fixed on the wall surface through the wall hanging piece.

In an alternative embodiment, the angle between the first length direction and the second length direction is 5 to 10 degrees.

In an alternative embodiment, the wall hanging piece further includes a fixation portion and a first connection portion; wherein the fixation portion is connected to a first side of the hanging portion through the first connection portion; the fixation portion is plate-shaped and parallel to the hanging portion, and a bolt hole for a fixation bolt to pass through is formed in the fixation portion; and in a direction perpendicular to the hanging portion, a plane of the fixation portion and a plane of the hanging portion are spaced apart at a certain distance.

In an alternative embodiment, at least two bolt holes are formed in the fixation portion, and a line connecting centers of the at least two bolt holes is parallel to the first length direction.

In an alternative embodiment, the fixation portion is provided with two bolt holes, wherein the two bolt holes are waist-shaped holes, and long axis directions of the two waist-shaped holes are perpendicular to each other.

In an alternative embodiment, the first connection portion includes: a first sub-plate connected to the fixation portion, wherein the first sub-plate is plate-shaped and is perpendicular to the fixation portion; and a second sub-plate connected between the first sub-plate and the first side of the hanging portion, wherein the second sub-plate is plate-shaped, and forms an included angle, between 165 and 172 degrees, with the hanging portion.

In an alternative embodiment, the hanging hole further includes: slide-in holes formed in the first sub-plate, the second sub-plate and the hanging portion and in communication with one end of the stripe-shaped hole; and a width of the end portion of the slide-in hole away from the stripe-shaped hole is larger than that of the end portion connected to the stripe-shaped hole.

In an alternative embodiment, the wall hanging piece further includes a support portion and a second connection portion; wherein the support portion is plate-shaped and is located in the same plane with the fixation portion; and the support portion is connected to the second side of the hanging portion through the second connection portion, and the first side and the second side are two opposite sides of the hanging portion.

In an alternative embodiment, the second connection portion is plate-shaped and is perpendicular to the hanging portion.

In an alternative embodiment, a plurality of openings are uniformly distributed on the fixation portion, the support portion and the first sub-plate.

In an alternative embodiment, the first sub-plate is further provided with a level meter mounting opening for fixing a level meter.

In an alternative embodiment, the hanging portion is provided with at least two hanging holes, and the at least two hanging holes have the same shape and are provided at intervals along the first length direction.

In an alternative embodiment, the wall hanging piece is fixedly connected to the wall surface in a mode that the first length direction is perpendicular to the gravity direction.

In an alternative embodiment, the display device is an electronic picture frame.

In an alternative embodiment, the suspension member comprises a neck portion connected to the back surface of the display panel and a cap portion connected to an end of the neck portion away from the display panel, wherein the neck portion passes through the terminal end, the cap portion is provided at a side of the terminal end away from the display panel.

DETAILED DESCRIPTION OF THE EMBODIMENTS

In order that those skilled in the art can better appreciate the technical schemes of the present disclosure, the following detailed description is given with reference to the accompanying drawings and the specific embodiments.

When the electronic picture frame is hung on an existing wall hanging piece, the electronic picture frame may easily slide along the stripe-shaped hole subject to a force in the horizontal direction. Thus, the existing wall hanging piece has a poor stability. To achieve a better stability for the hanging piece, the present disclosure provides a wall hanging piece and display device as follows.

Figure 1:
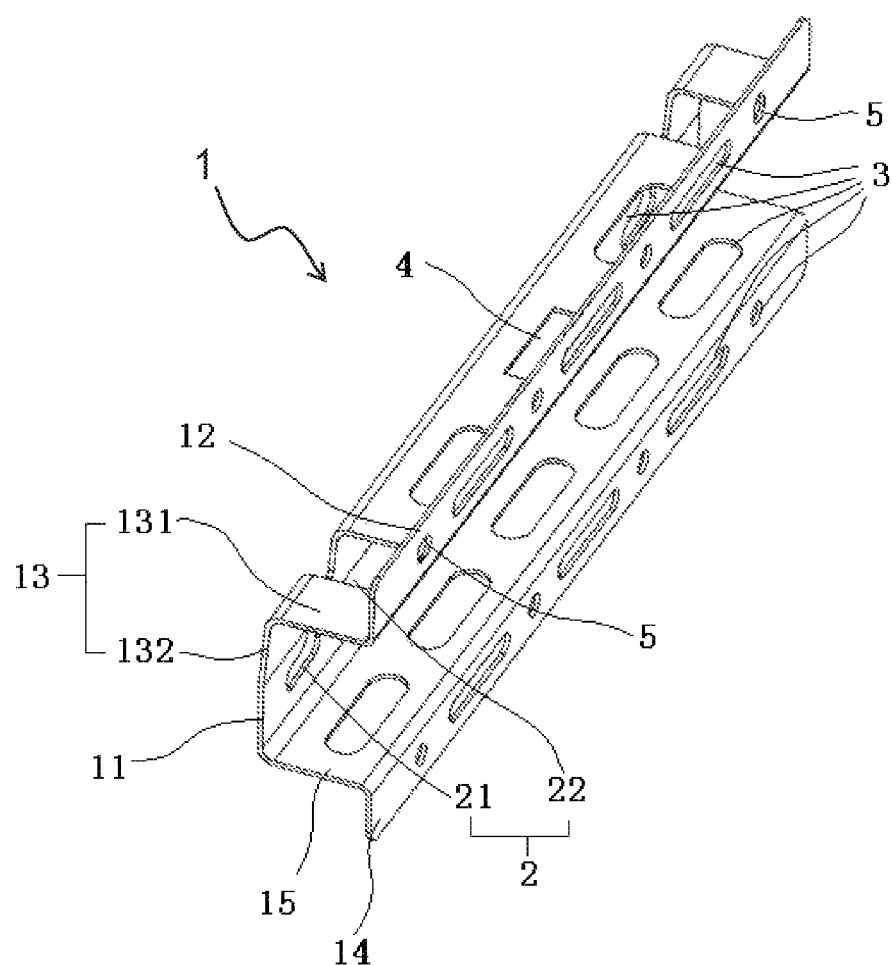
FIG. 1 is a schematic diagram of a wall hanging piece according to an embodiment of the present disclosure.
Figure 2:
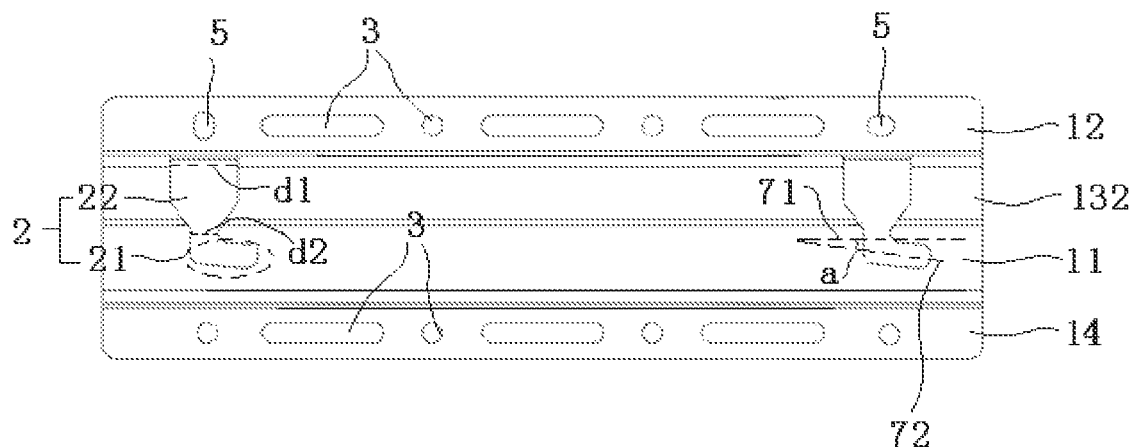
FIG. 2 is a schematic diagram of a wall hanging piece according to an embodiment of the present disclosure.
Figure 3:
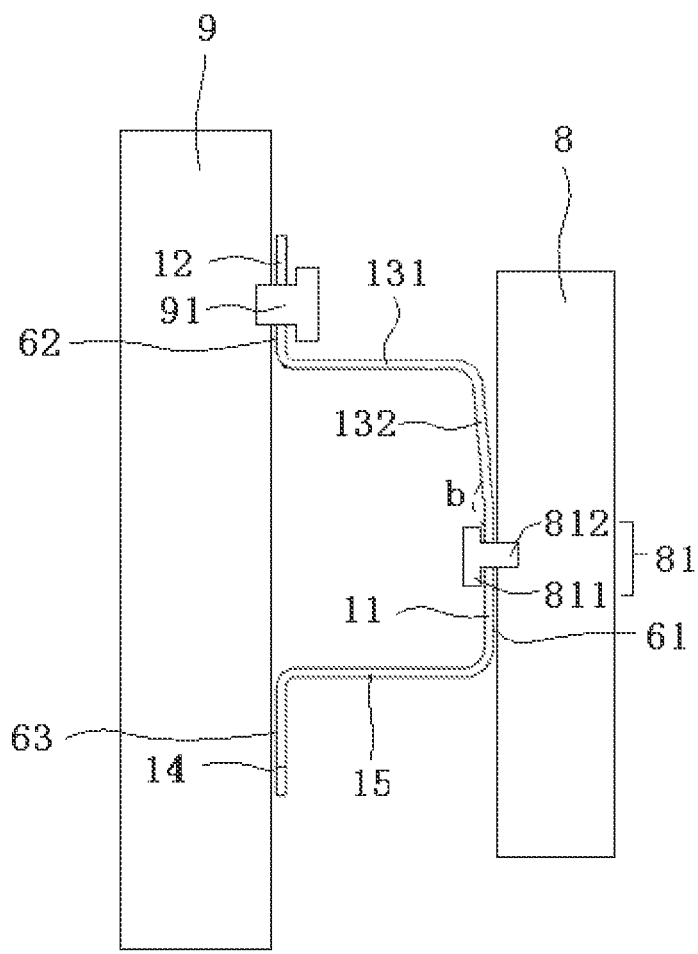
FIG. 3 is a schematic cross-sectional diagram of a display device assembly according to an embodiment of the present disclosure.

Referring to FIG. 1 to FIG. 3, in one aspect, in an embodiment of the present disclosure, there is provided a wall hanging piece for use of hanging a display device 8.

The wall hanging piece of the present embodiment may be used to hang a display device 8, such as an electronic picture frame, on a wall surface 9 to support the display device 8.

The wall hanging piece 1 includes a hanging portion 11, wherein the hanging portion 11 is plate-shaped and has a first length direction 71 (i.e. an extension direction of the hanging portion). The hanging portion 11 is provided with a hanging hole 2, the hanging hole 2 includes a stripe-shaped hole 21, the stripe-shaped hole 21 and has a second length direction 72 (i.e. an extension direction of the stripe-shaped hole 21), and a suspension member 81 of the display device 8 may pass through the stripe-shaped hole 21 and slide between a start end and a terminal end of the stripe-shaped hole 21. An included angle between the first length direction 71 and the second length direction 72 (angle a in FIG. 2) is greater than 0 degrees and less than 90 degrees, preferably between 5 and 10 degrees.

Specifically, the wall hanging piece 1 may be fixed to the wall surface 9. The hanging hole 2 of the hanging portion 11 of the wall hanging piece 1 includes a stripe-shaped hole 21. Two ends of the stripe-shaped hole 21 are a start end (left end of the stripe-shaped hole 21 in FIG. 2) and a terminal end (right end of the stripe-shaped hole 21 in FIG. 2), and a suspension member 81 (such as a hanging screw) on the display device 8 may pass through the stripe-shaped hole 21 and slide therein. Meanwhile, the hanging portion 11 has a predetermined first length direction 71, and the first length direction 71 is inclined with respect to a second length direction 72 of the hanging hole 2. When the wall hanging piece is fixed to an installation base surface 9 (e.g., a wall surface) in a proper manner, the first length direction 71 is in a horizontal direction, that is, perpendicular to the gravity direction. At this time, the terminal end of the stripe-shaped hole 21 is located lower than the start end, or the stripe-shaped hole 21 is inclined gradually downward from the start end to the terminal end when the first length direction 71 is horizontal.

When hanging the display device 8, the wall hanging piece may be first fixedly attached to the installation base surface 9 along the first length direction 71 which is horizontal (i.e., perpendicular to the gravity direction). Thereafter, the suspension member 81 on the display device 8 is driven to pass through the hanging hole 2, and slide from the start end to the terminal end of the stripe-shaped hole 21, and finally is stabilized at the terminal end. In this way, the display device 8 may be hung on the wall hanging piece, that is, the display device 8 may be hung on the wall surface 9. Since a position of the terminal end is now lower than that of the start end, the display device 8 is prone to slide from the start end to the terminal end. If the display device 8 slides from the terminal end to the start end along the stripe-shaped hole 21, the position of the display device 8 needs to be raised. That is, a certain gravity must be overcome to move the display device 8 from the terminal end to the start end. Therefore, the display device 8 hung on the wall hanging piece is not easy to slide laterally, and the stability thereof is better.

In an alternative embodiment, the hanging portion 11 may be provided with at least two hanging holes 2. The two hanging holes 2 have the same shape and are provided at intervals in the length direction 71.

For better stabilization of the display device 8, it is usually necessary to have at least two installation points, i.e. at least two suspension members 81 are provided on the display device 8. Referring to FIG. 1 and FIG. 2, at least two hanging holes 2 may be correspondingly provided, and the at least two hanging holes 2 should be provided at intervals along the first length direction 71 (and at the same height position), so that the display device 8 does not have a tendency of relative movement between the hanging holes 2.

In an alternative embodiment, the wall hanging piece further includes a fixation portion 12 and a first connection portion 13; wherein the fixation portion 12 is connected to a first side of the hanging portion 11 through a first connection portion 13; and the fixation portion 12 is plate-shaped and parallel to the hanging portion 11, and the fixation portion 12 is provided with a bolt hole 5 through which the fixation bolt 91 passes.

The fixation portion 12 is located on one side of the hanging portion 11 in a direction perpendicular to the hanging portion 11. Specifically, the plane of the fixation portion 12 is spaced apart from the plane of the hanging portion 11 by a predetermined distance in a direction perpendicular to the hanging portion 11. Referring to FIG. 1 to FIG. 3, a surface of the hanging portion 11 for contacting the display device 8 is a first contact surface 61. The plate-shaped fixation portion 12 is provided on the hanging portion 11 on a side away from the first contact surface 61 and parallel to the hanging portion 11. The fixation portion 12 has a second contact surface 62 for contacting the installation base surface 9 (e.g., a wall surface). Since the fixation portion 12 and the hanging portion 11 are located in different planes, the fixation portion 12 may be connected to the first side of the hanging portion 11 (an upper side of the hanging portion 11 in FIG. 2) through the first connection portion 13.

In an alternative embodiment, at least two bolt holes 5 are provided on the fixation portion 12, and a line connecting centers of the at least two bolt holes 5 is parallel to the first length direction 71. In an alternative embodiment, two bolt holes 5 are provided on the fixation portion 12, the two bolt holes 5 are waist-shaped holes, and the long axis directions of the two waist-shaped holes are perpendicular to each other.

Referring to FIG. 1 and FIG. 2, the connection portion may be provided with at least two bolt holes 5. The wall hanging piece 1 may be fixed to the installation base surface 9 by use of nailing the fixation bolt 91 which passes through the bolt hole 5 to the installation base surface 9 (e.g., a wall surface). Here, the direction of a line connecting the centers of at least two bolt holes 5 is the aforesaid first length direction 71. In an alternative embodiment, the at least two bolt holes 5 are waist-shaped holes with their long axes perpendicular to each other (e.g., with the long axes provided in vertical and horizontal directions, respectively). In this way, when the wall hanging piece 1 is fixed by the fixation bolt 91, the position of the wall hanging piece 1 may be adjusted within a small range to ensure the stability of the wall hanging piece 1 in the horizontal direction.

In an alternative embodiment, the first connection portion 13 includes: a first sub-plate 131 connected to the fixation portion 12, wherein the first sub-plate 131 is plate-shaped and perpendicular to the fixation portion 12; and a second sub-plate 132 connected between the first sub-plate 131 and the first side of the hanging portion 11, wherein the second sub-plate 132 is plate-shaped and has an included angle between 165 and 172 degrees with the hanging portion 11.

Referring to FIG. 1 and FIG. 3, the first connection portion 13 may include two plate-shaped portions, wherein the first sub-plate 131 is connected to and perpendicular to the fixation portion 12, and the second sub-plate 132 is connected to the hanging portion 11, and form an included angle (included angle b in FIG. 3) between 165 and 172 degrees with the hanging portion 11. In other words, the second sub-plate 132 is bent 8 to 15 degrees toward one side of the fixation portion 12 with respect to the hanging portion 11. Thus, the suspension member 81 is facilitated to slide in from the slide-in hole 22. Of course, referring to FIG. 1, the slide-in hole 22 may extend all the way to the first sub-plate 131, i.e., a part of the hanging hole 2 may be opened "upward".

In an alternative embodiment, the wall hanging piece further includes a support portion 14 and a second connection portion 15;

The support portion 14 is plate-shaped and in the same plane as the fixation portion 12;

The support portion 14 is connected to a second side of the hanging portion 11 through a second connection portion 15, and the first side and the second side are two opposite sides of the mounting portion 11.

In an alternative embodiment, the second connection portion 15 is plate-shaped and perpendicular to the hanging portion 11.

Specifically, the wall hanging piece 1 includes a plate-shaped support portion 14 which is located in the same plane as the fixation portion 12 and has a third contact surface 63 for contacting the installation base surface 9 (e.g., a wall surface). The support portion 14 is connected to a second side (a lower side of the hanging portion 11 in FIG. 2) of the hanging portion 11 by a second connection portion 15, and the second connection portion 15 may be plate-shaped and perpendicular to the hanging portion 11. In use, referring to FIG. 3, the wall hanging piece is approximately "Ω" shaped as a whole when viewed from the side, and the support portion 14 is located lower than the fixation portion 12, as shown in FIG. 3. In the embodiment of the present disclosure, the fixation portion 12 is fixed on the installation base surface 9, and the display device 8 is provided on the hanging portion 11. The support portion 14 is supported on the wall 9 under the hanging portion 11, and disperses partial gravity of the display device 8, thereby improving the strength and stability of the structure.

In an alternative embodiment, the hanging hole further includes a slide-in hole 22, which is provided on the first sub-plate 131, the second sub-plate 132, and the hanging portion 11, and the slide-in hole 22 is in communication with one end (start end) of the stripe-shaped holes 21; and the width of the end of the slide-in hole 22 away from the stripe-shaped hole 21 (d1 in FIG. 2) is greater than the width of the end connected to the strip-shaped hole 21 (d 2 in FIG. 2).

Specifically, referring to FIG. 1 and FIG. 2, the hanging hole 2 may include a slide-in hole 22 connected to a start end of the stripe-shaped hole 21, and the slide-in hole 22 has an enlarged size and is in communication with the first sub-plate 131. In this way, when the wall hanging piece is fixed on the installation base surface 9, the portion of the slide-in hole 22 on the first sub-plate 131 is opened upward, so that the suspension member 81 of the display device 8 does not have to directly pass through the stripe-shaped hole 21, but the suspension member 81 of the display device 8 may first enter the slide-in hole 22 and then slide from the slide-in hole 22 to the start end of the stripe-shaped hole 21, and thereby facilitating the installation.

In an alternative embodiment, referring to FIG. 1 and FIG. 2, the fixation portion 12, the support portion 14 and the first sub-plate 131 are all provided with a plurality of weight-reduction openings 3 distributed uniformly.

That is, in order to reduce the weight of the wall hanging piece, a plurality of weight-reduction openings 3 may be formed in the fixation portion 12, the support portion 14, and the first sub-plate 131 without affecting the strength thereof. It should be noted that, in order to ensure strength, there may be no weight-reduction openings on the hanging portion 11 and the second sub-plate 132. The weight-reduction openings 3 should be distributed evenly over the respective location. Of course, the number, size and position, etc. of the weight-reduction openings 3 may be set as desired. For example, among some of the larger sized weight-reduction openings 3, smaller sized weight-reduction openings 3 may be provided for ensuring strength. It should be noted that, in order to secure strength, in the case wherein the weight-reduction openings 3 having smaller sizes are provided among the weight-reduction openings 3 having larger sizes, the weight-reduction openings are not provided on the aforesaid hanging portion 11 and the second sub-plate 132 either.

Of course, it is also possible for the weight-reduction openings 3 to be provided on the support portion 14 through which the fixation bolts pass for a better fixation of the wall hanging piece. At this time, the partial weight-reduction openings 3 may also serve as bolt holes.

In an alternative embodiment, the first sub-plate 131 is further provided with a level meter mounting opening 4 for fixing a level.

As mentioned above, when the wall hanging piece is in use, the first length direction 71 of the hanging portion 11 should be perpendicular to the gravity direction, i.e. the wall hanging piece should be installed horizontally. Hence, it is of great importance to ensure that the wall hanging piece be installed horizontally. In this regard, referring to FIG. 1, a level meter mounting opening 4 may be provided on the first sub-plate 131, wherein a level meter may be provided as a reference for determining the direction of the wall hanging piece in an installation.

Referring to FIG. 1 to FIG. 3, in an embodiment of the present disclosure, there is provided a display device, including:

the wall hanging piece according to the aforesaid embodiment, wherein the wall hanging piece is fixedly connected to the installation base surface 9 in a mode that the first length direction 71 is perpendicular to the gravity direction; and a display device 8 including a display panel 83, wherein the display panel 83 is provided with a display surface and a back surface opposite to the display surface, a protruding suspension member 81 is provided on the back surface of the display panel, and the suspension member 81 passes through the terminal end of a hanging hole 2 of wall hanging piece.

That is, referring to FIG. 3, when the above wall hanging piece is fixed on the wall surface 9 in a horizontal manner (e.g. fixed by the fixation bolt 91), the suspension member 81 on the back surface of the display device 8 may pass through the hanging hole 2, and slide from the slide-in hole 22 to the start end of the stripe-shaped hole 21, and then slide to the terminal end, so as to form a stable display device assembly.

In an alternative embodiment, the suspension member 81 includes a neck portion 811 connected to the back surface of the display panel 83, and a cap portion 812 connected to an end of the neck portion 811 away from the display panel, wherein the neck portion 811 passes through the terminal end, and the cap portion 812 is located at a side of the terminal end away from the display panel.

Referring to FIG. 3, the suspension member 81 may include a thin neck portion 811 and an enlarged cap portion 812 connecting an end of the neck portion 811 away from the display panel. For example, the suspension member 81 may be a hanging screw screwed to the back surface of the display panel, and the cap portion 812 may be a nut of the hanging screw. In this way, the hanging portion 11 of the wall hanging piece may be sandwiched between the cap portion 812 and the display panel, thereby positioning the display device 8 more stably.

Figure 4:
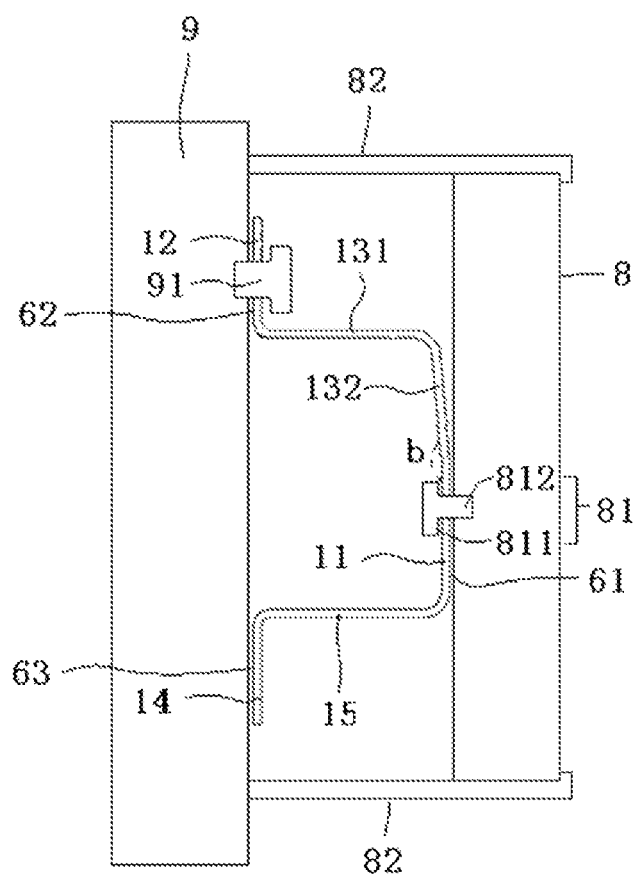
FIG. 4 is a schematic cross-sectional diagram of a display device assembly according to an embodiment of the present disclosure.

Referring to FIG. 4, in an embodiment of the present application, the display device may further include a display device frame 82. The display device frame 82 surrounds the outer periphery of the display device 8 and is in close contact with the wall surface 9. In this way, not only can dust be prevented, but also the appearance of the display device can be kept neat.

In one embodiment, the display device 8 is an electronic picture frame.

That is, the above wall hanging piece may be used for hanging an electronic picture frame. In this case, the display device is an electronic picture frame.

Of course, the above display device 8 may also be any product or component with a display function, such as a liquid crystal display panel, an Organic Light Emitting Diode (OLED) display panel, a tablet computer, a television, a display, a digital photo frame, and a navigator.

It can be appreciated that the above embodiments are merely exemplary embodiments employed to explain the principles of the present disclosure, however, the present disclosure is not limited thereto. It will be apparent to those skilled in the art that various changes and modifications can be made therein without departing from the spirit and scope of the disclosure, and these changes and modifications are to be considered within the scope of the disclosure.

The invention claimed is:

1. A display device, comprising:
a wall hanging piece configured to be fixed on a wall surface and comprising a hanging portion, wherein the hanging portion is plate-shaped and has a first length direction; a hanging hole provided on the hanging portion and comprising a stripe-shaped hole having a second length direction, and wherein an included angle between the first length direction and the second length direction is larger than 0 degree and smaller than 90 degrees; and a display panel comprising a display surface, a back surface opposite to the display surface, and a display frame provided around an outer periphery of the display surface; a suspension member provided on the back surface of the display panel, wherein the suspension member passes through a terminal end of the hanging hole of the wall hanging piece, and Wherein the display frame is in close contact with the wall surface in a state that the display panel is fixed on the wall surface through the wall hanging piece.

2. The display device according to claim 1, wherein the included angle between the first length direction and the second length direction is 5 to 10 degrees.

3. The display device according to claim 1, wherein the wall hanging piece further comprises a fixation portion and a first connection portion; wherein
the fixation portion is connected to a first side of the hanging portion through the first connection portion;
the fixation portion is plate-shaped and parallel to the hanging portion, and a bolt hole for a fixation bolt to pass through is formed in the fixation portion; and
in a direction perpendicular to the hanging portion, a plane of the fixation portion and a plane of the hanging portion are spaced apart at a certain distance.

4. The display device according to claim 3, wherein the fixation portion is provided with at least two bolt holes, and a line connecting centers of the at least two bolt holes is parallel to the first length direction.

5. The display device according to claim 4, wherein the fixation portion is provided with two bolt holes, wherein the two bolt holes are waist-shaped holes, and long axis directions of the two waist-shaped holes are perpendicular to each other.

6. The display device according to claim 3, wherein the first connection portion comprises:
a first sub-plate connected to the fixation portion, wherein the first sub-plate is plate-shaped and is perpendicular to the fixation portion; and
a second sub-plate connected between the first sub-plate and the first side of the hanging portion, wherein the second sub-plate is plate-shaped, and forms an included angle, between 165 and 172 degrees, with the hanging portion.

7. The display device of claim 6, wherein the hanging hole further comprises:
slide-in holes formed in the first sub-plate, the second sub-plate and the hanging portion and in communication with one end of the stripe-shaped hole; and
a width of an end portion of the slide-in hole away from the stripe-shaped hole is larger than that of the end portion connected to the stripe-shaped hole.

8. The display device according to claim 6, wherein the wall hanging piece further comprises a support portion and a second connection portion;
wherein the support portion is plate-shaped and is located in the same plane with the fixation portion; and
the support portion is connected to the second side of the hanging portion through the second connection portion, wherein the first side and the second side are two opposite sides of the hanging portion.

9. The display device according to claim 8, wherein the second connection portion is plate-shaped and is perpendicular to the hanging portion.

10. The display device according to claim 8, wherein
a plurality of openings are evenly distributed on the fixation portion, the support portion and the first sub-plate.

11. The display device according to claim 6, wherein
the first sub-plate is further provided with a level meter mounting opening for fixing a level meter.

12. The display device according to claim 1, wherein
the hanging portion is provided with at least two hanging holes, and the at least two hanging holes are identical in shape and are provided at intervals along the first length direction.

13. The display device according to claim 1, wherein
the wall hanging piece is fixedly connected to the wall surface in a mode that the first length direction is perpendicular to the gravity direction.

14. The display device according to claim 13, wherein
the display device is an electronic picture frame.

15. The display device according to claim 13, wherein
the suspension member comprises a neck portion connected to the back surface of the display panel and a cap portion connected to an end of the neck portion away from the display surface, wherein the neck portion passes through the terminal end, and the cap portion is provided at a side of the terminal end away from the display surface.

\* \* \* \* \*